United States Patent
Jou et al.

(10) Patent No.: US 8,445,896 B2
(45) Date of Patent: May 21, 2013

(54) ORGANIC LIGHT-EMITTING DIODE DEVICE WITH HIGH COLOR RENDERING

(75) Inventors: Jwo-Huei Jou, Hsinchu (TW);
Chun-Jen Lin, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 380 days.

(21) Appl. No.: 12/855,146

(22) Filed: Aug. 12, 2010

(65) Prior Publication Data
US 2011/0254033 A1 Oct. 20, 2011

(30) Foreign Application Priority Data
Apr. 19, 2010 (TW) .............................. 99112140 A (51) Int. Cl.
*H01L 51/50* (2006.01)
(52) U.S. Cl.
USPC .................................. 257/40; 257/79; 257/98

(58) Field of Classification Search
USPC ................................................ 257/79, 40, 98
See application file for complete search history.

(56) References Cited

U.S. PATENT DOCUMENTS 8,030,665 B2 * 10/2011 Nagahama et al. ............. 257/79
2006/0231845 A1 * 10/2006 Chen ............................... 257/79

* cited by examiner

*Primary Examiner* — Marcos D. Pizarro
*Assistant Examiner* — Tifney L Skyles (57) ABSTRACT

The present invention discloses an organic light-emitting diode (OLED) device with high color rendering comprising a base plate, a first conductive layer, a plurality of white light emitting layers, and a second conductive layer, wherein the spectra of the white light emitting layers possess characteristics of complementarities so as to enhance the color rendering of the emitted white light, and at least one carrier regulating layer is selectively disposed between every two white light emitting layers so as to increase the emitting efficiency and color rendering.

6 Claims, 6 Drawing Sheets

ORGANIC LIGHT-EMITTING DIODE DEVICE WITH HIGH COLOR RENDERING

This application claims foreign priority from a Taiwan Patent Application, Ser. No. 099112140, filed on Apr. 19, 2010.

BACKGROUND OF THE INVENTION

1. Field of the Invention

The present invention relates to an organic light-emitting diode (OLED) device, and more particularly to an OLED device comprising a plurality of white light emitting layers with complementary spectra so as to enhance the color rendering of the emitted white light.

2. Description of the Prior Art

An organic electro-luminescence display (Organic EL Display), also known as an organic light emitting diode (OLED), was invented by C. W. Tang and S. A. VanSlyk et al. of Eastman Kodak Company in 1987 and manufactured by a vacuum evaporation method. A hole transporting material and an electron counterpart are respectively deposited on a transparent indium tin oxide (abbreviated as ITO) glass, and then a metal electrode is vapor-deposited thereon to form the self-luminescent OLED apparatus. Due to high brightness, fast response speed, light weight, compactness, true color, no difference in viewing angles, no need of liquid crystal display (LCD) type backlight plates as well as a saving in light sources and low power consumption, it has become a new generation display.

Figure 1:
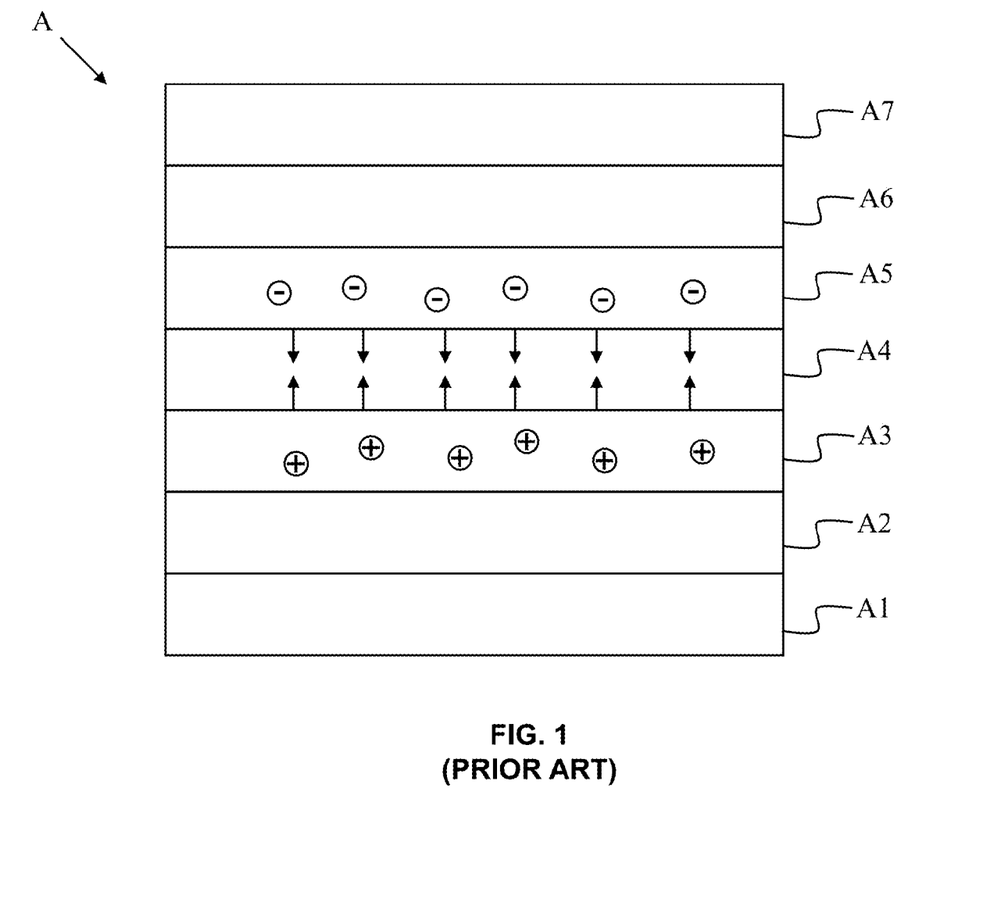
FIG. 1 is a cross-sectional diagram of a conventional structure of an OLED apparatus.

Referring to FIG. 1, a cross-sectional diagram of a conventional structure of an OLED apparatus is illustrated. The conventional OLED apparatus A sequentially includes, from the bottom to the top, a transparent substrate A1, a transparent anode (indium tin oxide, ITO) A2, a hole transporting layer (HTL) A3, an organic emissive layer (EL) A4, an electron transporting layer (ETL) A5, an electron injection layer (EIL) A6, and a metal cathode A7. When a forward bias is applied, holes are injected from the anode A2 and electrons are injected from the cathode A7. Due to the potential difference resulted from the external electrical field, the electrons and holes move in the thin film and hence recombine in the organic emissive layer A4. A part of the energy released by the recombination of the electron and hole pairs excites the emissive molecules from a ground-state to an excited-state in the organic emissive layer A4. As the emissive molecules fall back form the excited-state to the ground state, a certain portion of the energy is released to emit light.

A color rendering index (CRI) is an important light-emitting efficiency index of the OLED device. The CRI means the relative difference between the revealed colors of an object illuminated by an artificial light source and the revealed colors of the object illuminated by a sunbeam. The lower value of the CRI, the more differences between the above revealed colors, and the colors presented by the artificial light source lose more fidelity. In contrast, the higher value of the CRI, the better color rendering of the artificial light source, that it, the colors presented by the artificial light source lose are close to those presented by the sunbeam.

In order to increase the color rendering of the OLED device, most conventional techniques combine a plurality of OLED devices and regulate some parameters, such as color temperature and wavelength, to achieve the effect of high color rendering. However, due to the foregoing conventional technique has to combine several kinds of OLED devices emitting different colors to achieve the effect of high color rendering, then it not only consumes more production cost but also increases the dimension of the products.

In view of this, it is necessary to provide an improved OLED device which can achieve the effect of high color rendering by employing fewer components and saving production costs.

SUMMARY OF THE INVENTION

In view of the above shortcomings of the prior art, the inventor of the present invention resorted to past experience, imagination, and creativity, performed experiments and researches repeatedly, and eventually devised the present invention, an organic light-emitting diode (OLED) device with high color rendering.

The major objective of the present invention is to provide the OLED device with high color rendering, which employs the characteristic of the plural white light emitting layers having the complementary spectra so as to achieve the effect of high color rendering and decrease the number of components and the production cost.

Another objective of the present invention is to provide the OLED device with high color rendering, which employs the characteristic of two layers of white light emitting layers having the complementary spectra so as to achieve the effect of high color rendering and decrease the number of components and the production cost.

Consequently, the present invention provides an organic light-emitting diode (OLED) device with high color rendering comprising: a base plate; a first conductive layer being disposed on the base plate; a plurality of white light emitting layers being disposed on the first conductive layer, wherein the spectra of the plurality of white light emitting layers possess characteristics of complementarities so as to enhance the color rendering of the emitted white light; and a second conductive layer being disposed on the plurality of white light emitting layers.

Furthermore, the present invention provides another organic light-emitting diode (OLED) device with high color rendering comprising: a base plate; a first conductive layer being disposed on the base plate; a first white light emitting layer being disposed on the first conductive layer and having a first spectrum; a second white light emitting layer being disposed on the first white light emitting layer and having a second spectrum, wherein the first spectrum and the second spectrum are complementary so as to increase the color rendering of the emitted white light; and a second conductive layer being disposed on the second white light emitting layer.

BRIEF DESCRIPTION OF THE DRAWINGS

For a complete understanding of the aspects, structures and techniques of the invention, reference should be made to the following detailed description and accompanying drawings wherein.

DETAILED DESCRIPTION OF THE PREFERRED EMBODIMENTS

To achieve the foregoing objectives and effects, the inventors combine more than two layers of white light emitting layers and employ the characteristic of complementary spectra, thus achieving an OLED device with high color rendering of the present invention. Hereinafter, the OLED device with high color rendering according to a first preferred embodiment, a second preferred embodiment and a third preferred embodiment of the present invention will be described in detail for illustrating the structural features and principles of the present invention.

Figure 2:
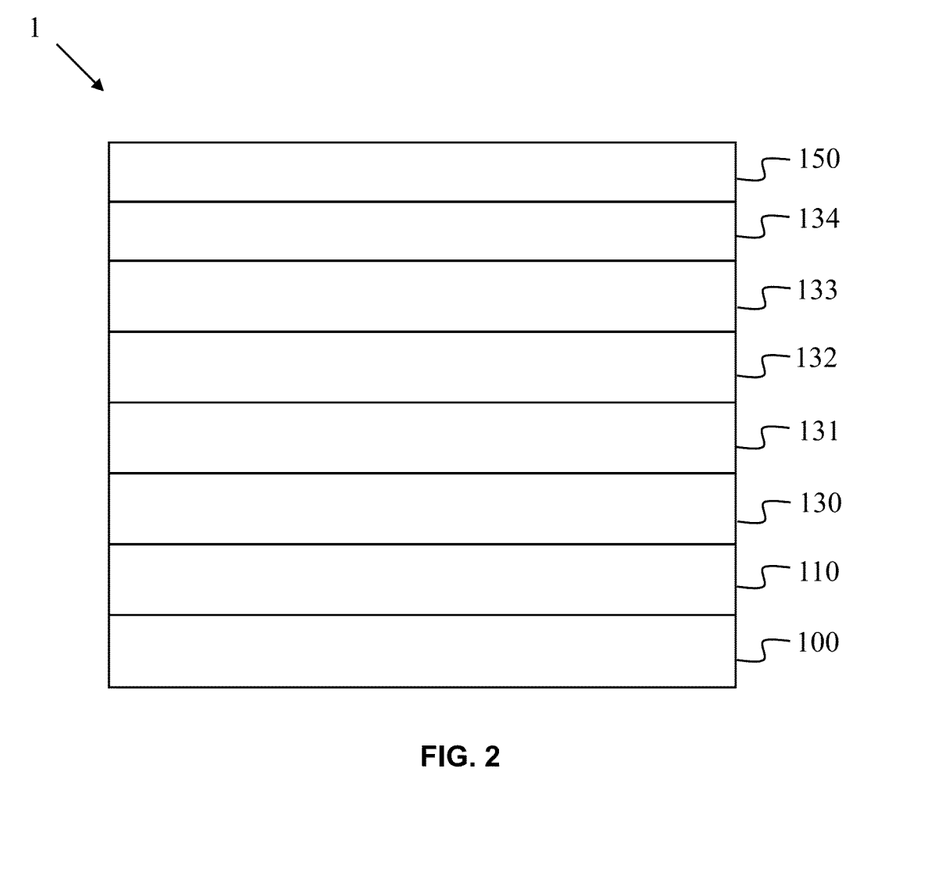
FIG. 2 is a cross-sectional diagram of an OLED device with high color rendering according to a first preferred embodiment of the present invention.

Referring to FIG. 2, a cross-sectional diagram of the OLED device with high color rendering according to the first preferred embodiment of the present invention is illustrated. The OLED device 1 of the present invention includes: a base plate 100, which is a glass substrate; a first conductive layer 110 being disposed on the base plate 100 and being an anode, wherein the first conductive layer 110 is made of indium tin oxide (ITO) and the thickness of the first conductive layer 110 is 125 nm; a plurality of white light emitting layers 130, 131, 132, 133, and 134 being disposed on the first conductive layer 110, wherein the spectra of the plurality of white light emitting layers 130, 131, 132, 133, and 134 possess characteristics of complementarities so as to enhance the color rendering of the emitted white light; and a second conductive layer 150 being disposed on the plurality of white light emitting layers 130, 131, 132, 133, and 134, wherein the second conductive layer 150 is a cathode.

In the above first preferred embodiment, although five layers of white light emitting layers 130, 131, 132, 133, and 134 are illustrated, however, a plurality of white light emitting layers are included in the scope of the present invention and 2-5 layers of white light emitting layers can achieve the best emitting effect. Furthermore, the plurality of white light emitting layers 130, 131, 132, 133, and 134 can be made of fluorescent light-emitting materials or phosphorescent light-emitting materials.

Moreover, a carrier regulating layer can be selectively disposed between every two white light emitting layers 130, 131, 132, 133, and 134 so as to promote the average distribution of the carriers and increase the emitting efficiency and color rendering.

Moreover, in practice, a hole injection layer (HIL) and a hole transport layer (HTL) can be disposed between the first conductive layer 110 and the plurality of white light emitting layers 130, 131, 132, 133, and 134, wherein the hole injection layer is disposed on the first conductive layer 110, and the hole transport layer is disposed between the hole injection layer and the plurality of white light emitting layers 130, 131, 132, 133, and 134. In addition, an electron transport layer and a electron injection layer can be disposed between the plurality of white light emitting layers 130, 131, 132, 133, and 134 and the second conductive layer 150, wherein the electron transport layer is disposed on the plurality of white light emitting layers 130, 131, 132, 133, and 134, and the electron injection layer is disposed between the electron transport layer and the second conductive layer 150.

Figure 3:
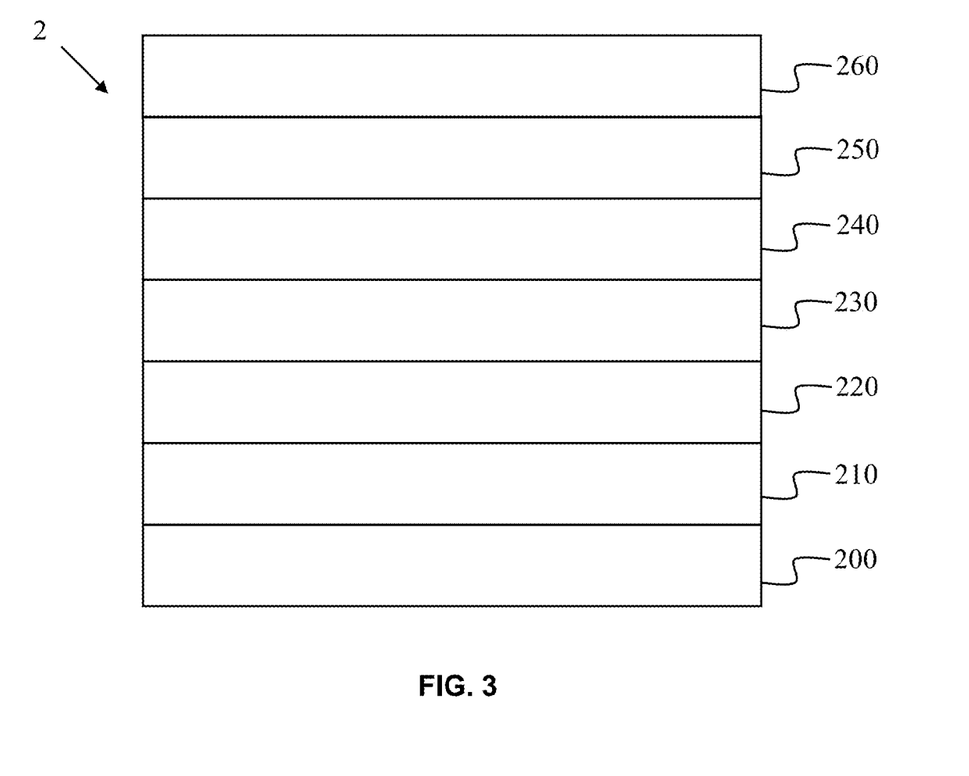
FIG. 3 is a cross-sectional diagram of the OLED device with high color rendering according to a second preferred embodiment of the present invention.

Referring to FIG. 3, a cross-sectional diagram of the OLED device with high color rendering according to the second preferred embodiment of the present invention is illustrated. The OLED device 2 includes: a base plate 200, which is a glass substrate; a first conductive layer 210 being disposed on the base plate 200 and being an anode, wherein the first conductive layer 210 is made of indium tin oxide (ITO) and the thickness of the first conductive layer 210 is 125 nm; a hole transport layer 220 being disposed on the first conductive layer 210, wherein the hole transport layer 220 is made of PEDOT:PSS and the thickness of the hole transport layer 220 is 10 nm-50 nm; a first white light emitting layer 230 being disposed on the hole transport layer 220, wherein the first white light emitting layer 230 has a first spectrum and the thickness of the first white light emitting layer 230 is 10 nm-30 nm; a second white light emitting layer 240 being disposed on the first white light emitting layer 230 and having a second spectrum, wherein the thickness of the second white light emitting layer 240 is 40 nm-100 nm, and the first spectrum and the second spectrum are complementary to each other so as to increase the color rendering of the emitted white light; an electron transport layer 250 being disposed on the second white light emitting layer 240, wherein the electron transport layer 250 is made of TPBi and the thickness of the electron transport layer 250 is 32 nm; and a second conductive layer, which is disposed on the electron transport layer 250.

In the above second preferred embodiment, the first white light emitting layer 230 is made of phosphorescent light-emitting materials and can emitting phosphorescent white light. The dyes contained in the phosphorescent light-emitting materials include: TCTA, which is used as a host; FIrpic being a blue dye, wherein the concentration of FIrpic is 0.01 wt %-25 wt % relative to the concentration of the host; Ir(ppy)$_3$ being a green dye, wherein the concentration of Ir(ppy)$_3$ is 0.01 wt %-10 wt % relative to the concentration of the host; and Ir(piq)$_2$(acac) being a crimson dye, wherein the concentration of Ir(piq)$_2$(acac) is 0.01 wt %-10 wt % relative to the concentration of the host. The second white light emitting layer 240 is made of fluorescent light-emitting materials and can emitting fluorescent white light. The dyes contained in the fluorescent light-emitting materials include: MDP3FL, which is a deep blue dye; and Rubrene being an orange (yellow) dye, wherein the concentration of Rubrene is 0.01 wt %-25 wt % relative to the concentration of the deep blue dye.

The above mentioned host, hole transport layer 220 and electron transport layer 250 can be used as carrier transport layers, which have the property of blocking the carriers and distributing the carriers in the emitting area with a best condition, so as to increase the light-emitting efficiency of the two white light emitting layers 230 and 240.

Furthermore, a hole injection layer can be disposed between the first conductive layer 210 and the hole transport layer 220, and an electron injection layer can be disposed between the electron transport layer 250 and the second conductive layer 260.

Figure 4:
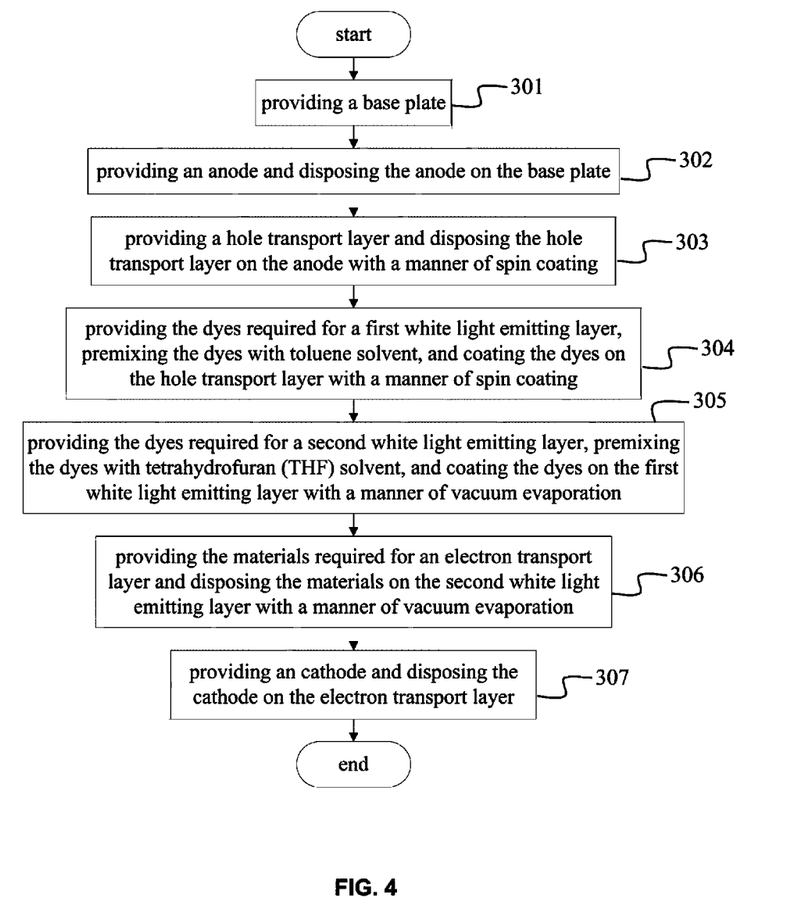
FIG. 4 is a flow chart diagram of a method for manufacturing the OLED device with high color rendering according to the second preferred embodiment of the present invention.

Referring to FIG. 4, a flow chart diagram of a method for manufacturing the OLED device with high color rendering according to the second preferred embodiment of the present invention is illustrated. The method comprises the steps of: (step 301) providing a base plate; (step 302) providing an anode and disposing the anode on the base plate; (step 303) providing a hole transport layer and disposing the hole transport layer on the anode with a manner of spin coating; (step 304) providing the dyes required for a first white light emitting layer, premixing the dyes with toluene solvent, and coating the dyes on the hole transport layer with a manner of spin coating; (step 305) providing the dyes required for a second white light emitting layer, premixing the dyes with tetrahydrofuran (THF) solvent, and coating the dyes on the first white light emitting layer with a manner of vacuum evaporation; (step 306) providing the materials required for an electron transport layer and disposing the materials on the second white light emitting layer with a manner of vacuum evaporation; and (step 307) providing an cathode and disposing the cathode on the electron transport layer. The process of the above method for manufacturing the OLED device can be a wet-type process, a dry-type process or a tandem-type process.

Figure 5:
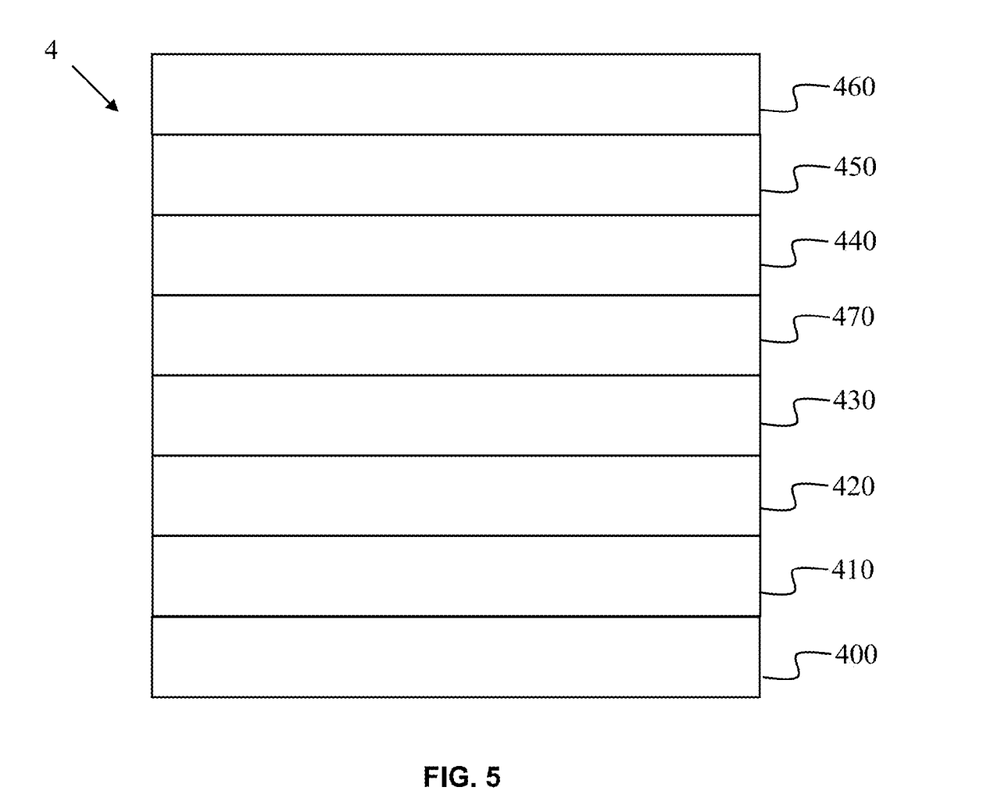
FIG. 5 is a cross-sectional diagram of the OLED device with high color rendering according to a third preferred embodiment of the present invention.

Referring to FIG. 5, a cross-sectional diagram of the OLED device with high color rendering according to the third preferred embodiment of the present invention is illustrated. Owing to most of the structures and the manufacturing method of the third preferred embodiment are in common with those of the second preferred embodiment, the details of these previously described comments are omitted herein. The difference is that a carrier regulating layer 470 is included in the OLED device of the third preferred embodiment, and the carrier regulating layer 470 is disposed between a first white light emitting layer 430 and a second white light emitting layer 440. The carrier regulating layer 470 can promote the average distribution of the carriers and increase the emitting efficiency and color rendering. The carrier regulating layer 470 is made of TPBi and has a thickness of 1 nm-10 nm.

In the above second preferred embodiment and the third preferred embodiment, in addition to the aforementioned dyes used for manufacturing the first white light emitting layers 230, 430, the second white light emitting layers 240, 440 and the carrier regulating layer 470, in practice, the dyes can be replaced by the following kinds of dyes: the blue (light or deep) dye can be selected from BczVbi, Perylene, TBPe, BCzVB, DPAVBi, DPAVBi, DPAVB, BDAVBi, FIr6, BNP3FL, MDP3FL, N-BDAVBi, Spiro-BDAVBi, DBzA, fac-Ir(Pmb)$_2$, mer-Ir(Pmb)$_3$ and DSA-Ph; the green dye can be selected from Coumarin6, C545T, DMQA, Ir(ppy)$_2$(acac), Ir(mppy)$_3$, TTPA, TPA, BA-TTB, BA-TAD, BA-NPB and Zn(BTZ)$_2$; the red dye can be selected from DCM, DCM2, DCJT, DCJTB, Er55, Eu(dbm)$_3$(Phen), Ir(btp)$_2$(acac), Ir(fliq)$_2$(acac), Ir(flq)$_2$(acac), Ru(dtb-bpy)$_3$2(PF6), Ir(2-phq)$_3$, Ir(2-phq)$_2$(acac), Ir(BT)$_2$(acac), Os(fppz)$_2$(PPhMe2)$_2$, Os(bpftz)$_2$(PPh2Me)$_2$, Os(fptz)$_2$(PPh2Me)$_2$ and Os(bpftz)$_2$(PPhMe2)$_2$; the orange (yellow) dye can be TBRb; the materials of the carrier regulating layer can be selected from TCTA, BSB, Dczppy, OXD-7 and Bphen.

In order to prove that the OLED device of the present invention has the effect of increasing the color rendering, a first comparative embodiment and a second comparative embodiment are compared with the second preferred embodiment and the third preferred embodiment of the present invention for the relative light-emitting efficiency and color rendering. There is only a first white light emitting layer disposed between a hole transport layer and a electron transport layer in the first comparative embodiment without a second white light emitting layer, and the material of the first white light emitting layer is the same as that of the second preferred embodiment and the third preferred embodiment; there is only a second white light emitting layer disposed between a hole transport layer and a electron transport layer in the second comparative embodiment without a first white light emitting layer, and the material of the second white light emitting layer is the same as that of the second preferred embodiment and the third preferred embodiment.

Figure 6:
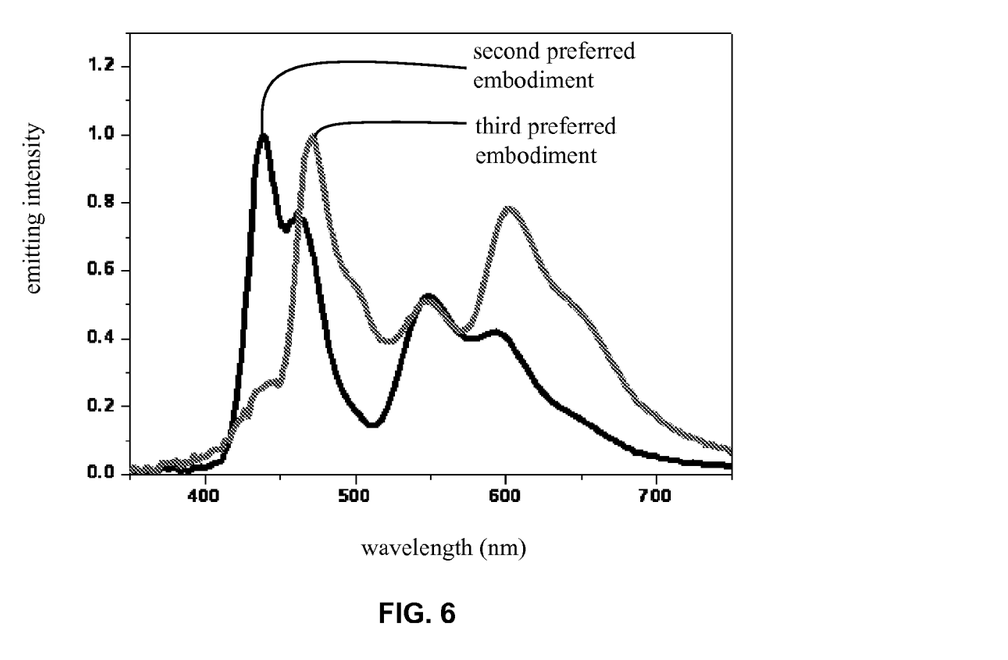
FIG. 6 is a spectral diagram of the second preferred embodiment and the third preferred embodiment of the present invention.
Figure 7:
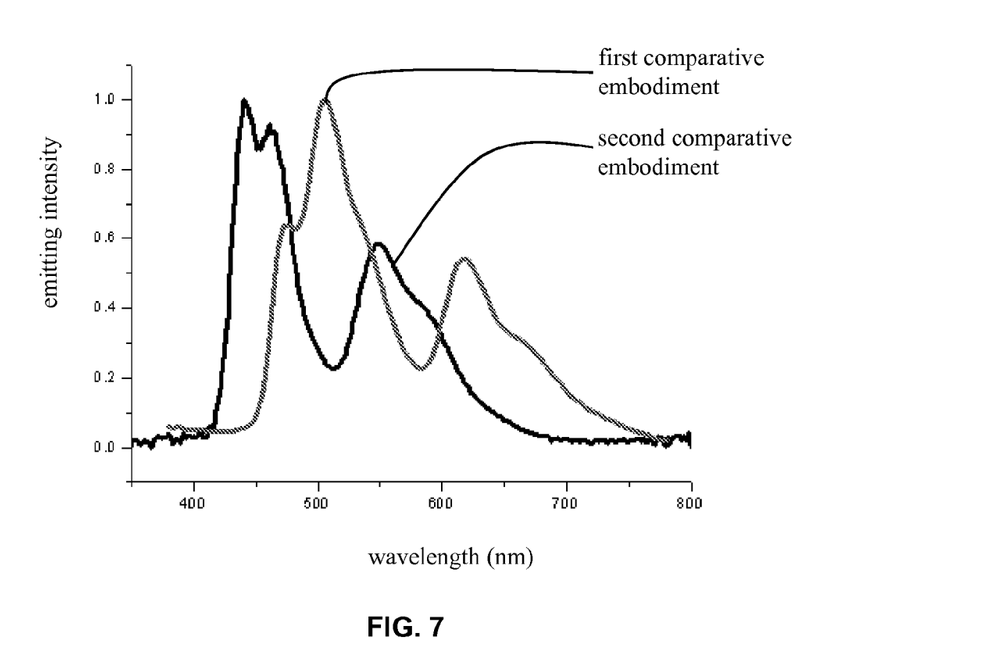
FIG. 7 is a spectral diagram of a first comparative embodiment and a second comparative embodiment.

Referring to FIG. 6 and FIG. 7, FIG. 6 is a spectral diagram of the second preferred embodiment and the third preferred embodiment of the present invention, and FIG. 7 is a spectral diagram of the first comparative embodiment and the second comparative embodiment. The spectral diagrams of the first comparative embodiment and the second comparative embodiment having merely one white light emitting layer illustrate lower emitting intensity in some wavelength ranges, and the emitting intensity changes vigorously, thus the color rendering is not good enough; wherein the CRI of the first comparative embodiment and the second comparative embodiment is about 69. Owing to the second preferred embodiment having the characteristics of complementarities in the spectra of the two white light emitting layers, the emitting intensity of the combined spectrum changes smoothly, and thus the color rendering of the second preferred embodiment is better than those of the first comparative embodiment and the second comparative embodiment; wherein the CRI of the second preferred embodiment is about 80. Owing to the carrier regulating layer disposed between the two white light emitting layers of the third preferred embodiment can promote the average distribution of the carriers and increase the emitting efficiency, the color rendering of the third preferred embodiment is better than that of the second preferred embodiment; the CRI of the third preferred embodiment is about 84. Thus, the combination of the two white light emitting layers having the complementary spectra can promote the color rendering, and the carrier regulating layer disposed between the two white light emitting layers can further promote the color rendering.

On the other hand, the concentration of the dyes used in the white light emitting layers also may influence the color rendering. In the related research of the present invention, several first white light emitting layers are made of crimson dyes with different concentration and the color rendering of these first white light emitting layers are detected. The results indicate that the crimson dye with 0.7% makes the OLED device reach a CRI of 89-91, the crimson dye with 1.0% makes the OLED device reach a CRI of 96-98, and the crimson dye with 1.5% makes the OLED device reach a CRI of 87-88. Thus, the concentration of the dyes indeed can affect the color rendering of the OLED device, and the optimum adjustment to the concentration of the dyes can effectively promote the color rendering of the OLED device.

By the detailed description of the present invention, the following advantages of the present invention can be derived:
1. The present invention employing two or plural white light emitting layers can achieve the effect of high color rendering, and the present invention includes less components and simpler method than the conventional technique, thus the production cost can be decreased and the dimension of the OLED device can be controlled effectively.
2. The carrier regulating layer used in the present invention can further increase the color rendering of the OLED device, and the present invention includes less components and simpler method than the conventional technique, thus the production cost can be decreased and the dimension of the OLED device can be controlled effectively.

It should be understood that the embodiments of the present invention described herein are merely illustrative of the technical concepts and features of the present invention and are not meant to limit the scope of the invention. Those skilled in the art, after reading the present disclosure, will know how to practice the invention. Various variations or modifications can be made without departing from the spirit

What is claimed is:

1. An organic light-emitting diode (OLED) device with high color rendering comprising:
   a base plate, being a glass substrate;
   a first conductive layer, being made of indium tin oxide (ITO) and disposed on the base plate for being as an anode;
   a hole transport layer, being formed on the first conductive layer;
   a first white light emitting layer, being disposed on the first conductive layer, wherein the first white light emitting layer is made of phosphorescent light-emitting materials and can emitting a phosphorescent white light with a first spectrum, moreover the first white light emitting layer consists of a host of TCTA, a blue dye of FIrpic, a green dye of Ir(ppy)$_3$, and a crimson dye of Ir(piq)$_2$(acac), in which the concentration of FIrpic, Ir(ppy)$_3$ and Ir(piq)$_2$(acac) relative to the concentration of the host are respectively ranged from 0.01 wt. % to 25 wt %, from 0.01 wt % to 10 wt % and from 0.01 wt % to 10 wt %;
   a second white light emitting layer, being disposed on the first white light emitting layer, and consisting of a deep blue dye of MDP3FL and an orange (yellow) dye of Rubrene, wherein the concentration of Rubrene is ranged from 0.01 wt % to 25 wt % relative to the concentration of the deep blue dye;
   an electron transport layer, being disposed on the second white light emitting layer;
   a second conductive layer, being disposed on the electron transport layer for being as a cathode; and
   wherein the second white light emitting layer is made of fluorescent light-emitting materials and can emitting a fluorescent white light with a second spectrum, and the first spectrum and the second spectrum are complementary to each other so as to increase the color rendering of the emitted white light.

2. The organic light-emitting diode (OLED) device with high color rendering according to claim 1, further comprising at least one carrier regulating layer that can be selectively disposed between every two white light emitting layers so as to promote the average distribution of the carriers and increase the emitting efficiency and color rendering.

3. The organic light-emitting diode (OLED) device with high color rendering according to claim 1, wherein the electron transport layer is made of TPBi and the thickness of the electron transport layer is 32 nm.

4. The organic light-emitting diode (OLED) device with high color rendering according to claim 1, wherein the hole transport layer is made of PEDOT:PSS and the thickness of the hole transport layer is ranged from 10 nm to 50 nm.

5. The organic light-emitting diode (OLED) device with high color rendering according to claim 1, wherein the thickness of the first white light emitting layer is ranged from 10 nm to 30 nm.

6. The organic light-emitting diode (OLED) device with high color rendering according to claim 1, wherein the thickness of the second white light emitting layer is ranged from 40 nm to 100 nm.

* * * * *